United States Patent [19]
Clark et al.

[11] Patent Number: 4,802,951
[45] Date of Patent: Feb. 7, 1989

[54] METHOD FOR PARALLEL FABRICATION OF NANOMETER SCALE MULTI-DEVICE STRUCTURES

[75] Inventors: Noel A. Clark; Kenneth Douglas, both of Boulder, Colo.; Kenneth J. Rothschild, Newton, Mass.

[73] Assignees: Trustees of Boston University, Boston, Mass.; University of Colorado Foundation, Inc., Boulder, Colo.

[21] Appl. No.: 136,992

[22] Filed: Dec. 23, 1987

Related U.S. Application Data

[62] Division of Ser. No. 837,376, Mar. 7, 1986, Pat. No. 4,728,591.

[51] Int. Cl.[4] .......................... B44C 1/22; B05D 3/06; G03C 15/00; G03C 5/00
[52] U.S. Cl. .................................. 156/630; 156/633; 156/643; 156/644; 156/656; 156/659.1; 427/43.1; 427/282; 427/307
[58] Field of Search ............... 156/630, 633, 643, 644, 156/655, 656, 657, 659, 662, 902, 272.2, 273.9, 274.4; 428/333, 474.4; 430/5, 313, 314, 315, 316, 317, 318, 323, 324; 427/43.1, 96, 98, 272, 282, 307

[56] References Cited

U.S. PATENT DOCUMENTS

| 4,103,064 | 7/1978 | McAlear et al. | 428/333 |
| 4,103,073 | 7/1978 | McAlear et al. | 428/474 |
| 4,496,419 | 1/1985 | Nulman et al. | 156/643 |
| 4,659,429 | 4/1987 | Isaacson et al. | 156/644 |

Primary Examiner—William A. Powell
Attorney, Agent, or Firm—Cushman, Darby & Cushman

[57] ABSTRACT

Articles exhibiting fabricated structures with nanometer size scale features (nanostructures), typically a device comprising nanostructures of a functional material on or in a substrate of dissimilar material, are produced by a method employing a substrate base or coating and a thin layer serving as a lithographic mask or template, consisting of a self-assembled ordered material array, typically a periodic array of molecules such as undenatured proteins, exhibiting holes, thickness or density variations. It is possible to produce complex structures containing large numbers of nanometers scale elements through a small number of simple steps.

17 Claims, 7 Drawing Sheets

METHOD FOR PARALLEL FABRICATION OF NANOMETER SCALE MULTI-DEVICE STRUCTURES

This is a division of application Ser. No. 837,376, filed Mar. 7, 1986, now U.S. Pat. No. 4,728,591.

BACKGROUND OF THE INVENTION

1. Field of the Invention

This invention relates to the formation of structures on a nanometer size scale.

2. Description of the Prior Art

In recent years interest has increased in the fabrication of electronic, optical and/or biomolecular devices of nanometer size (nanometer structures). An attractive feature, of such molecular size devices is the vast number that may be packed into a small area, i.e., the high density that is possible. Computers which incorporate such devices would have significantly increased memory and speed. The incorporation of biological molecules into such devices is also desirable and would be facilitated by the ability to fabricate structures on a nanometer scale. The fabrication of devices on the nanometer level also is desirable since new physical effects not obtainable for larger size devices beome important. An example is the patterning of surfaces for utilization of surface enhanced Raman scattering phenomena.

Current methods of producing such nanometer devices include writing on the surface of a substrate or on a substrate covered with an electron sensitive resist material with a focused electron beam. This serial method of device fabrication is, however, limited by the long times required to produce the vast number of nanometer devices possible in small areas (i.e., over 10,000 devices in a micron square area) Additionally, conventional methods do not presently offer convenient means of incorporating active biological molecules into nanometer size devices.

A particularly advantageous method of producing microdevices and micropatterns consists of lithographic reproduction of an existing pattern from a suitable mask onto the device substrate. Such a preexisting pattern is transferred by placing the mask in proximity to the underlying substrate. Then the pattern is etched into or applied to the substrate using a variety of methods including exposure to a beam consisting of reactive ions, electromagnetic radiation or reactive molecules The mask is normally produced by ,a serial writing method such as focusing an electron beam on a suitably sensitive material such as a resist material Current lithographic methods are limited by the size of the individual features which can be embedded in a mask, the size of the mask as well as the time necessary to produce these masks In particular, currently employed lithographic masks will typically have features which are micron in dimension whereas nanometer microdevice fabrication requires masks containing nanometer scale details. While serial writing of such a pattern on a nanometer scale is possible, using known methods such as focused electron beams, the necessary time for production of such a pattern is a serious limitation for the practical fabrication of nanometer devices See, for example, U.S. Pat. Nos. 4,103,064 and 4,103,073, Craighead et al, "Ultra-Small Metal Particle Arrays Produced by High Resolution Electron-Beam Lithography", J. Appl. Phys. 53 (11) (Nov. 1982), pp. 7186–7188, Mochel et al "Electron Beam Writing on a 20-A Scale in Metal 8-Aluminas", Appl. Phys. Lett. 42 (4) (Feb. 1983), pp. 392–394, Isaacson "Electrons, Ions and Photons in Submicron Research", Submicron Research, Cornell University (1984), pp. 28–32.

Attempts have also been made to formulate techniques to fabricate nanometer scale devices "in parallel" wherein a number of devices are made at the same time in a relatively few number of steps. For example, it has been suggested that large biological molecules may be used as a mask to apply a nanometer scale pattern of material on a substrate. Suggestions for the particular large molecule to be employed have included DNA and denatured proteins., See Carter, "Molecular Level Fabrication Techniques and Molecular Electron Devices", J. Vac. Sci. Technol. Bl (4) (Oct.-Dec. 1983), pp. 959–968, Carter, "Biotechnical Synergism in Molecular Electronics", Nonlinear Electrodynamics in Biological Systems, Plenum Press, pp. 260–273 and Tucker, "Biochips: Can Molecules Compute?", High Technology, Vol. 4, No. 2 (Feb. 1984), pp. 36–47 and 79, see particularly p. 46.

SUMMARY OF THE INVENTION

The present invention advances techniques for creating nanostructures beyond those techniques known to date as described above. In accordance with the present invention, arrays consisting of numerous identical nanometer scale structures are created in a few steps. Such nanostructures are based on nanometer patterns created by self-assembled two-dimensional molecular arrays.

In the present invention, a substrate surface, which can either serve as a passive support such as a carbon film or have intrinsic solid state properties used in the device, such as silicon, supports a self-assembled two-dimensional molecular array exhibiting density, thikness and/or chemical reactivity variations. The array may typically consist of two-dimensionally crystallized nondenatured proteins which retain their native properties of a very regular nature. Alternatively, the array may consist of other non-biological material.

The two-dimensional self-assembled molecular array may be used to transfer a pattern contained in the molecula,r array onto either an underlying substrate or an overlying coating. In a simple embodiment of the present invention, a self-assembled molecular array includes a two-dimensionally ordered array of holes formed by nondenatured protein molecules bound to a substrate base. A functional material to be used in the nanostructure is deposited onto the substrate surface through the holes. The molecular array is then removed to leave a substrate surface covered by a periodic array of islands composed of the material. A particular advantage of employing nondenatured protein molecules is their extremely regular nature.

In another embodiment, the two-dimensional self-assembled molecular array which is bound to a base support substrate is overcoated with a thin film of material to be used in the nanostructure. The film may be of metal, insulator or semiconductor. The film is then irradiated with an ion beam, for example, to replicate the pattern of holes in the underlying molecular array. In fact, the present invention may be employed to create improved masks and templates to be used in lithographic production of nanometer structures.

Alternatively, holes through the selfassembled molecular array may be employed as a pattern for etching the substrate.

Composite devices, biomolecular-solid state heterostructures consisting of biologically active molecules and other functionable materials may be produced according to the present invention.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, of which.

DETAILED DESCRIPTION Of THE PRESENTLY PREFERRED EXEMPLARY EMBODIMENTS

Figure 1:
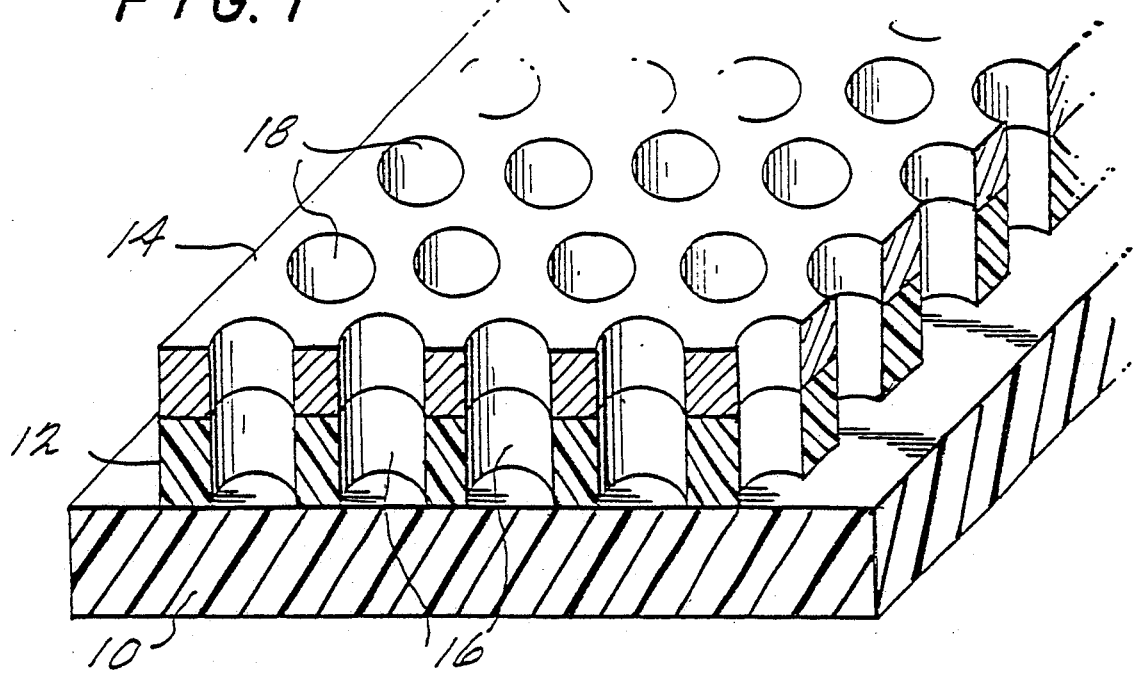
FIG. 1 is a schematic diagram of a nanostructure including a self-assembled two-dimensional molecular array used as a template for an overlayer.

A fundamental structural unit that forms the basis of all embodiments of this application and is illustrated in FIGS. 1-5 includes a substrate 10 supporting a self-assembled two-dimensionally ordered molecular array containing thickness, density or chemical reactivity variations in a spatial pattern having a characteristic dimension of 1-50 nanometers. Of course, a pattern of variations in thickness may very well be a pattern of holes extending through array 12.

Substrate 10 may be made of a passive supporting material such as a molecularly smooth amorphous carbon, crystalline mica or graphite or a functional material to be used in the ultimate nanodevice such as silicon. The substrate base may also consist of a multilayer composite such as layers 10a illustrated in FIGS. 8A-8E. Multilayered substrate 10a may include silicon coated by a thin insulating layer of silicon dioxide or other material, for example.

In some cases, the substrate base may be a well defined area which is part of a larger base support. For example, the base may contain a micropattern consisting of a thin layer of conductive material such as aluminum which is deposited by conventional lithographic methods. In this case, array 12 could be bound selectively to specific areas on base 10 delineated by the micropattern. This can be accomplished by using a variety of conventional methods which serve to activate the specific areas delineated by the micropattern so that they bind array 12. For example, array 12 could be made of a material that normally carries an electrical charge and which is attracted to the patterned conducting layer through application of a voltage differential between this layer and a second electrode placed above substrate 10. Alternatively, a pattern which is lithographically transferred to a substrate base using conventional methods can be selectively activated by using glow discharge. In this case, surrounding areas which do not contain the micropattern would be prevented from developing an attractive charge because they would be coated with an insulating layer.

Self-assembled array 12 can be conventionally produced using a variety.of protein molecules including hemocyanin,,cytochrome oxidase, porin from the *E. coli* outer membrane, acetylcholine from nicotinic end-plate receptors, rhodopsin from photoreceptor membranes and in some cases are found to occur, in nature such as in the S-layer from *Sulfolobus acidocaldarius* or the purple membrane from *Halobacterium halobium*. Approximately 1000 distinct two-dimensional crystallizable proteins are known. A general method for production of such a self-assembled protein array is described by Keegstra and van Bruggen, "Electron Microscopy at Molecular Dimensions" Springer-Verlag, New York (1980), pp. 318-327.

A second example of array 12 involving the membrane protein rhodopsin is given by B.L. Scott et al, "Two-Dimensional Crystals in Detergent-Extracted Disk Membranes From Frog Rod Outer Segments (ROS)" Bio. Phys. J. Vol. 33, (1981) p. 293a. Self-assembled membrane arrays 12 are typically 5-20 nanometers in thickness and normally have an overall diameter between 0.1 and 1 micron. It is possible, however, to form larger membranes using established procedures such as membrane fusion which consists of adding a detergent such as cetyltriammonium bromide (CTAB) to a suspension of membranes and then incubating at room temperature for several days.

Examples of array 12 which contain an ordered pattern of through holes include the two-dimensional array formed by hemocyanin, a respiratory protein from the spiny lobster *Panulirus interruptus*, according to the method of Keegstra and van Bruggen, supra, and the S-layer which is naturally found in the facultatively sulphur oxidizing microorganism, *Sulfolobus acidocaldarius* and isolated according to the method of Michel et al, Electron Microscopy at Molecular Dimension, Ed. by W. Baumesiter and W. Vogell, Springer-Verlag (1980), p. 27. Numerous other examples of array 12 which form naturally or can be formed using known methods include those formed from the proteins cytochrome oxidase, porin and connexon.

Bacteriorhodopsin in the purple membrane of *Halobacterium halobium* and rhodopsin isolated from frog or bovine retinas form arrays 12 which have a pattern of two-dimensional density and thickness variations. The two-dimensional crystals formed from ribosomes, well known in the literature, form a biomolecular assembly containing both protein and nucleic acid which may be used as array 12.

Array 12 may also have chemical reactivity variations spatially distributed thereover Examples of materials which may be used for array 12 exhibiting chemical reactivity variations include protein molecules which exhibit catalytic activity or act as a coenzyme for catalytic activity. Array 12 of purple membrane formed from bacteriorhodopsin molecules exhibit such a spatially varying chemical reactivity since it acts as a light-driven proton pump. Hence, a local pH gradient will be created at the site of each bacteriorhodopsin molecule during illumination of the entire array with light of 570 nm wavelength. This local pH gradient could be used to activate pH sensitive reactions in the molecules of an overlayer thereby producing a structural pattern within the overlayer on a nanometer scale dimension. A large number of reactions are known which are pH sensitive including reactions involving molecules contained in many commercially available pH sensing papers.

Array 12 can also consist of the surface layer of a three-dimensional crystal. For example, most three-dimensional crystals formed from protein molecules consist of large void spaces filled with water which comprises up to 80% of the total volume of the crystal. The top surface layer exhibits a large variation in contour which is ideal for acting as a template in the same manner as a monolayer two-dimensional crystal as described herein. Examples include crystals formed from the protein molecules lysozyme and hemoglobin.

Additionally, many examples of two- and three-dimensional array 12 of non-biological origin exist which are useful in the present invention. For example, zeolites from a class of crystalline materials characterized by periodic arrays of nanometer dimension holes may be employed in the present invention, as illustrated by Wright et al, "Localizing Active Sites in Zeolitic Catalysts", Nature, Vol. 318, p. 611 (1985). These non-biological arrays could be used as single crystal surfaces or in the form of thin films, grown epitaxially as unit cell monolayers on a crystalline substrate. Microscopic colloidal particles of uniform size are another non-biological example useful as array 12. Such an array is formed by slowly altering the chemical properties of a colloidal particle suspension in contact with substrate 10 to be coated in such a way as to cause particles to come out of suspension and deposit on the surface of substrate 10. In an aqueous suspension of polymer spheres, for example, the salt concentration can be increased. When this, process is done slowly, ordered arrays of particles of diameters from 5 nm to about 1000 nm can be deposited on the surface.

Various techniques may be employed to bind array 12 to substrate 10 or array 12 may be formed on substrate 10 in situ. Binding can be accomplished electrostatically which is typically achieved by treating substrate 10 chemically or by placing substrate 10 in a glow discharge chamber. Array 12 is then applied as an aqueous suspension of membrane fragments on substrate 10 which is subsequently dried by evaporation, blotting with an adsorbant medium or by mechanical shaking. Alternatively, array 12 can be bound using a binding layer between substrate 10 and array 12 which can consist of an application of polylysine or another molecule which binds preferentially to substrate 10 and array 12.

To chemically bind array 12 to substrate 10, substrate 10 may be chemically treated or coated in such a way as to promote the binding of array 12. For example, a substrate of carbon may be coated with an adsorbed molecular layer of the cationic polyamino acid poly-l-lysine in order to bind array 12 with an anionic surface. Alternatively, for example, the anionic polyamino acid poly-l-glutamate will bind cationic array 12 to substrate 10. For example, substrate 10 may be placed in a vacuum and exposed to a mild plasma etch (glow discharge) prior to the application of the polyamino acid. A 10% solution of the polyamino acid is applied to substrate 10 and left to incubate for several minutes. Substrate 10 is then washed with distilled water and air dried. Array 12 is then applied to the coated substrate 10.

Array 12 may be bound to substrate 10 by electrical means when substrate 10 is selected to be electrically conducting. Conducting substrate 10 may be placed in contact with an aqueous suspension of two-dimensional ordered membrane sheets which carry a surface charge. Applying an electric field between substrate 10 and a second electrode in contact with: the suspension can both orient the sheets with one side preferentially facing substrate 10 and move the membrane sheets onto substrate 10. For example, purple membrane has been shown to exhibit ordering in suspension in applied electric fields. See, Keszthelyi, "Orientation of Purple Membrane by Electric Fields" Methods in Enzymology, Vol. 88, L. Packer (Editor), pp. 287–297.

Related orientational effects can be achieved by magnetic fields.

Electro-chemical means may be employed to bind array 12 to substrate 10. As an example, substrate 10 may have a patterned Ta/W film on one surface with an ordered array of holes in the Ta/W film exposing a carbon base. An oxide film is rapidly produced on the Ta/W film by applying 0.1 N NaOH to substrate 10 while applying a voltage between the metal film and the NaOH. This is accomplished by connecting the grid on which substrate 10 sits to the positive terminal of a battery and connecting the negative terminal to the NaOH solution via a small electrode. A resistor in series with the grid controls the current draw. In this fashion, an oxide layer is produced on the metal, while no oxide is formed on the exposed carbon holes. After deposition of the oxide layer, the grid is washed, dried and then glow discharged in order to make the carbon hydrophilic, for the subsequent adsorption of a different molecule, such as the protein ferritin. The ferritin is preferentially adsorbed on the exposed carbon holes and not on the metal oxide layer surrounding them.

It is also possible to crystallize array 12 directly on the surface of substrate 10 using the properties of the substrate to promote crystallization. This is accomplished using methods of two-dimensional protein crystallization well-known in the literature. An example given by Keegstra and van Bruggen, supra, involves the assembly of two-dimensional arrays of *Panulirus interruptus* hemocyanin. A small drop of hemocyanin protein in a 10 millimolar (mM) sodium acetate buffer is placed on an electron microscope grid having a parlodion-carbon supporting substrate: The grid, with the protein solution on top, is floated on a 50 mM sodium acetate solution for a time from 30 minutes to several hours at 4° C. with the specimen supporting substrate 10 acting as a membrane for dialysis. Then, the grid is washed and dried.

From the basic structure of array 12 on base 10, a number of alternative embodiments can be created. For example, as illustrated in FIG. 1, overlayer 14 may be applied on top of array 12. Overlayer 14 may consist of a thin layer typically 1-2.5 nanometers thick of a material selected for its ultimate function in subsequent steps in the nanometer structure fabrication. For example, when pattern 16 in array 12 includes holes, pattern 16 may be transferred into overlayer 14 by ion milling to form holes 18. As will be explained below, overlayer 14 may then be removed and used as a nanometer mask for further steps in the nanodevice fabrication. In this case, the material for overlayer 14 may be chosen for its flexibility and structural integrity. Alternatively, overlayer 14 may comprise a functional material in the ultimate nanodevice and be chosen for its optical/electronic properties.

Figure 4:
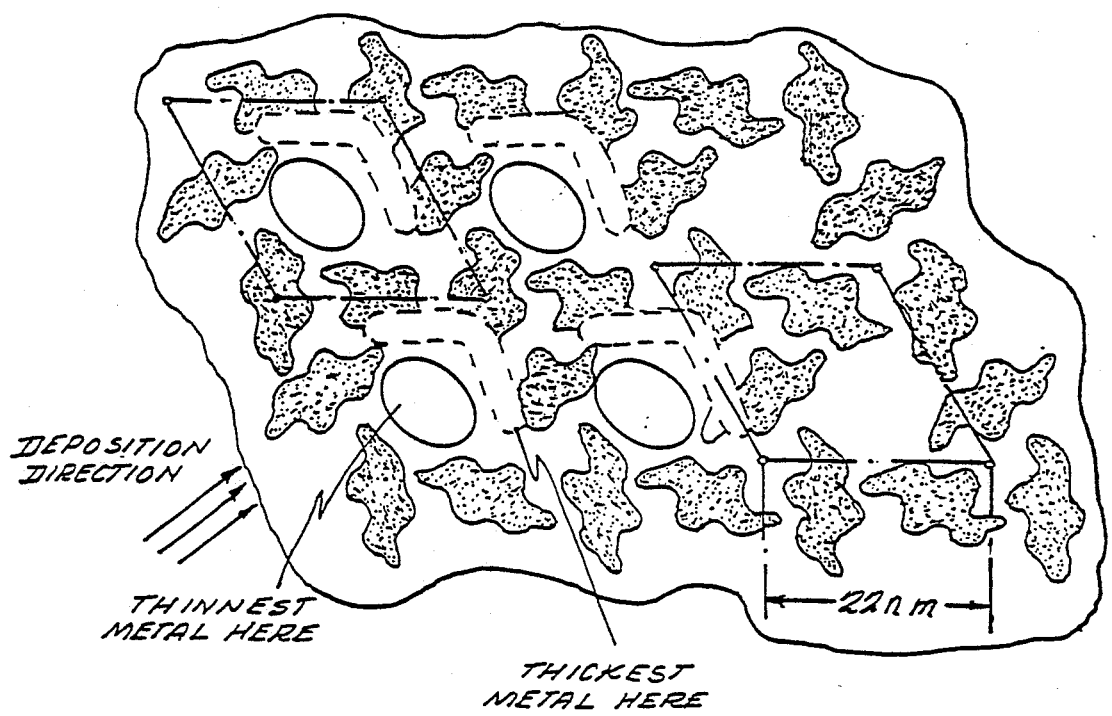
FIG. 4 is a schematic diagram of the electron density of the self-assembled two-dimensional molecular array from Sulfolobus acidocaldarius superimposed with the results of metal deposition.

A specific example of the embodiment illustrated in FIG. 1 will now be provided. In this embodiment, array 12 is the crystalline proteinaceous cell wall surface layer (S-layer) from the thermophilic bacterium *Sulfolobus acidocaldarius* a sulfur-oxidizing microorganism whose natural habitat is hot acidic springs. The S-layer consists of 10 nm thick monolayer periodic array of a single glycoprotein having a molecular weight in the range of 140-170 kdaltons. Specimens of purified S-layer show an array of protein dimers arranged as shown in FIG. 4, a basis of three dimers on a two-dimensional triangular lattice having a 22 nm lattice parameter. The three-dimensional structure is porous, the protein occupying 30% of the volume within the 10 nm thick sheet containing the S-layer.

Substrate 10 in this embodiment of the nanostructure device consists of a 30 nm thick amorphous carbon film which provides a molecularly smooth surface. The carbon film is deposited on an electron microscope grid 3 millimeters in diameter using conventional methods. The S-layers are employed in the form of aqueous suspensions (12 mg/ml) of primarily monolayer crystalline fragments of varying size up to 0.5 micron diameter. Adsorption of the S-layer to the carbon substrate is accomplished by exposing the substrate to a mild plasma etch (glow discharge) in order to remove organic contaminants and render carbon substrate base 10 hydrophilic. A drop of S-layer suspension is then placed in contact with substrate 10 and rinsed with double distilled water. Excess water is drawn off with filter paper and the preparation air dried.

Overlayer 14 is then deposited by evaporation. In this embodiment, overlayer 14 is a thin layer Ta/W which is chosen because of its fine grain. Application of overlayer 14 is accomplished by e-beam evaporation of 80% tantalum and 20% tungsten (by weight) at $2\times10^{-6}$ torr at room temperature at an incident angle of 40 degrees from the normal to substrate 10. This produced an average overlayer thickness of 1.2 nm as determined by a quartz crystal monitor and grain sizes of 2-3 nm as determined by electron microscopy.

To pattern overlayer 14 to assume pattern 16 of thickness or density variations in array 12, overlayer 14 is exposed to an argon ion mill for a short period of time in order to punch holes corresponding to variations 16 in array 12.

Substrate 10 in this example may consist of a large variety of materials. For example, for the purpose of electrical contact, substrate 10 may be fabricated from a conductor such as aluminum. Alternatively, substrate 10 may consist of a layered structure such as a conductor coated by a thin insulator such as aluminum and aluminum oxide or a semiconductor material such as a P-doped silicon. To provide a guide for binding array 12, or as a suitable surface for crystallization, substrate 10 may consist of a patterned surface produced by conventional scanning beam methods or by other methods described herein.

Alternatively, a liquid surface may be utilized since it is well known that many arrays such as purple membrane can be layered on the surface of a liquid such as water. All of the formation techniques described herein may be carried out with an array supported by such a liquid surface. One advantage of such a substrate 10 is the ease by which the patterned nanostructure is removed from liquid substrate 10.

Thus, some proteins, in particular biomembrane based systems, are easier to grow as large single crystals with the proteins and a lipid matrix at an air-water interface. Once formed, a two-dimensional protein crystal at an air-liquid interface could be used as a template for nanopatterning an evaporated metal overlayer 14 as has been described above. Patterned metal layer 14 could then be transferred to a solid substrate by the usual techniques employed to deposit surfactant (Langmuir-Blodgett) films. Alternatively, overlayer 14 once patterned, could be removed from two-dimensional array 12 by immersing substrate 10 in a fluid and floating it on the air-fluid interface as is routinely done for carbon-platinum freeze-fracture replicas.

Overlayer 14 may be part of a larger pattern formed using conventional methods of integrated circuit fabrication. In this case, a suitable mask formed from a resist is used to allow deposition to occur only in the desired areas including the area overlying array 12.

Overlayer 14 may also consist of a thin layer of material which has been patterned using the methods described herein. For example, a thin layer metal which has been patterned into a metal screen containing nanometer sized holes can be produced as described herein. This layer can be selectively bound directly over a two-dimensional self-assembled array 12 to serve as overlayer 14.

Alternatively, a nonpatterned overlayer 14 may be deposited on an array, and then coated with a second array 12. The second array is used to pattern the layer using masking techniques to be described and then removed. In a second fabrication step, the underlying array serves as a template for further patterning as described above. The two arrays could be commensurate, producing a periodic structure, or incommensurate, producing a modulated structure, as will be described below with respect to FIGS. 8A-8E.

A variety of overlayers 14 may be patterned using arrays 12 as templates, for example thin metal films as has been described above. As other examples, overlayer 14 itself may be a layered structure produced by multistage evaporation or by chemical treatment, e.g., oxidation, of an initially homogeneous film. A first layer of Ta/W may be followed by Pt, for example.

Figure 2:
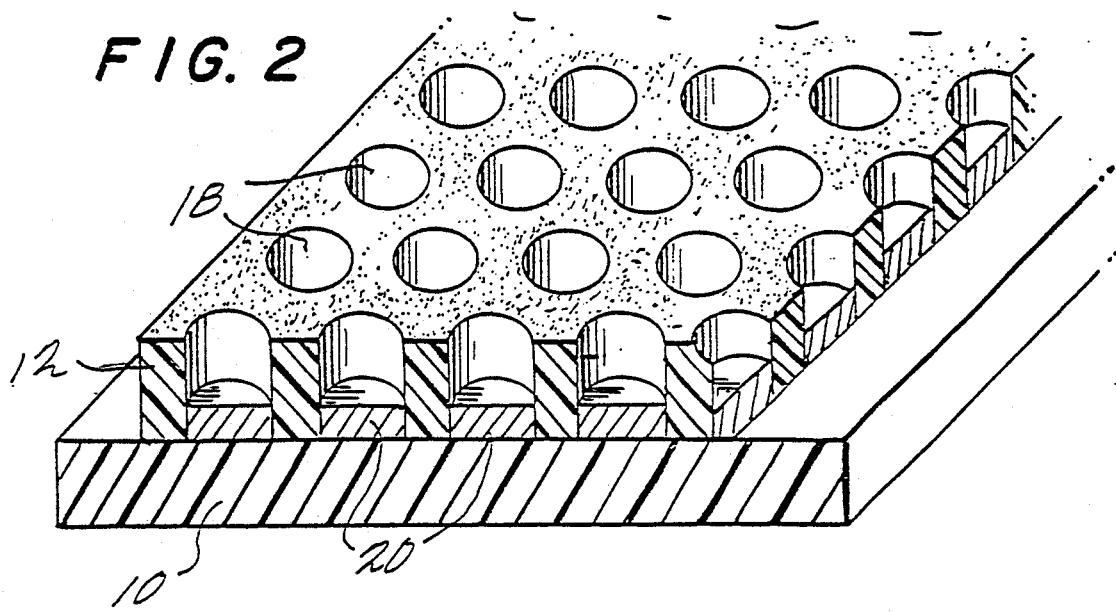
FIG. 2 is a schematic diagram of a nanostructure consisting of a self-assembled two-dimensional molecular array used as a mask for the deposition of additional material on a substrate.
Figure 3:
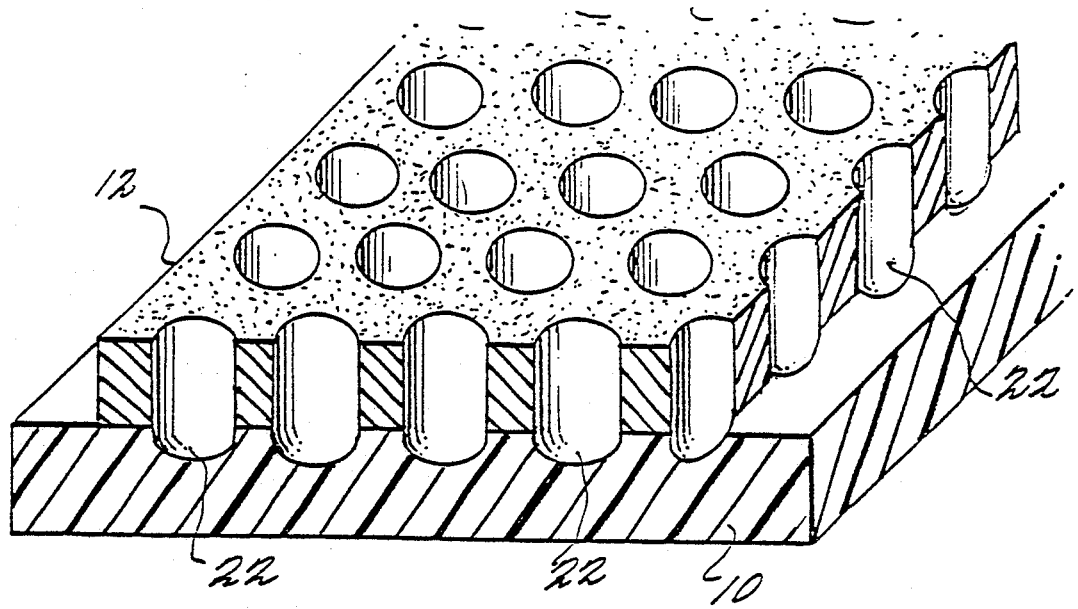
FIG. 3 is a schematic diagram of a nanostructure consisting of a self-assembled two-dimensional molecular array used as a mask for removing material from a substrate.

Instead of using array 12 as a template for producing a patterned overlayer 14, array 12 may be used as a mask for applying material on or in substrate 10 or removing material from substrate 10. In FIG. 2, array 12 is employed as a mask for forming deposits 20 on substrate 10. In FIG. 3, mask 12 is employed to control the removal of material from substrate 10 forming pits 22. In the embodiment of FIG. 2, array 12 advantageously has a pattern of through holes allowing penetration of atoms or molecules through array 12 to substrate 10. In the embodiment of FIG. 3, density or thickness variations in array 12 can be transferred directly into substrate 10 utilizing penetrating X-ray or electron beams which then react with substrate resist material. To form pits 22, an agent may be applied to the assembly which reacts directly with substrate 10 or is activated by the additional exposure of a penetrating beam such as visible light. Alternatively, the removal or alteration of the composition of base material 22 might occur through electrical conduction of ions through the channels formed in array 12.

Figure 5:
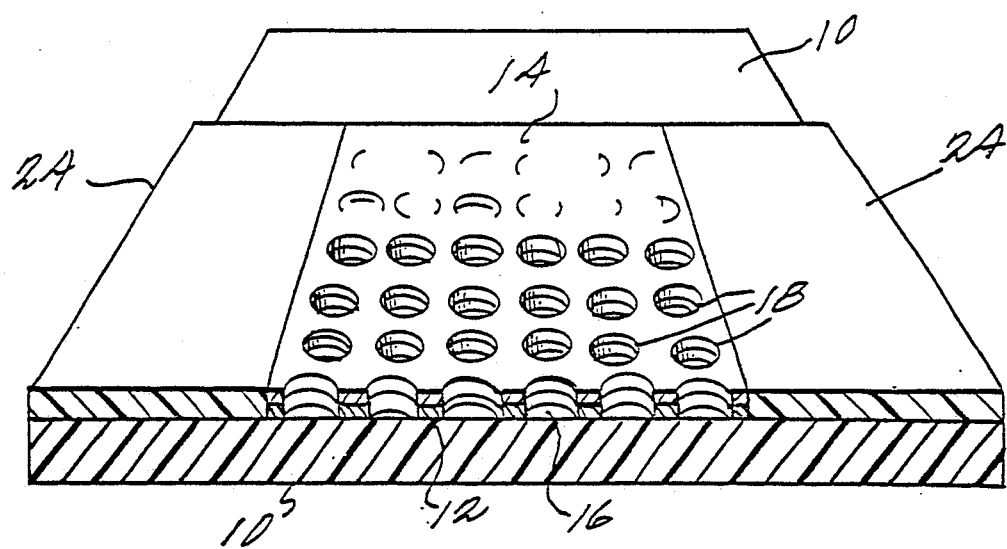
FIG. 5 is a schematic diagram of one possible finished nanostructure according to the present invention.

The embodiment illustrated in FIG. 5 is a more detailed version of that illustrated in FIG. 1 in that it consists of array 12 on substrate 10 with overlayer 14 having holes 18 therein. In this embodiment, holes 18 have a diameter of approximately 15 nm arranged on a triangular lattice with 20 nm periodicity. Holes 18 are formed in overlayer 14 which is best characterized as a lattice or screen consisting of two intersecting periodic sets of metal strips. Film 14, which is approximately 1 square micron in area, is part of larger micropattern which has been fabricated using conventional methods. Conducting electrod,e material 24 is disposed adjacent to array 12 and overlayer 14 to complete the assembly.

Figure 6A:
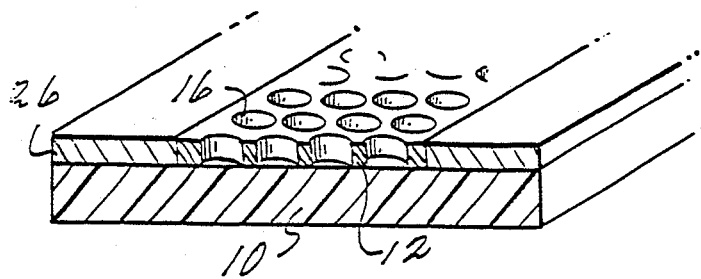
FIGS. 6A-6H schematically illustrate the process for forming the structure of FIG. 5.
Figure 6B:
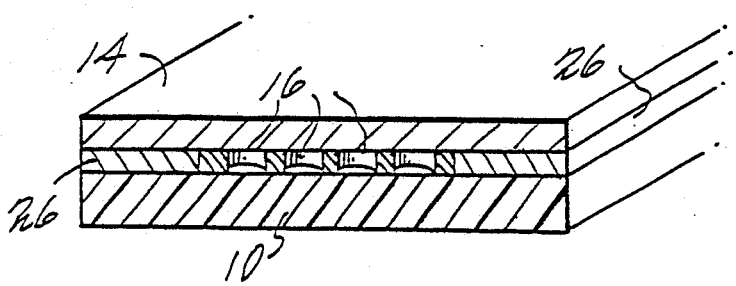

The method of forming the embodiment of FIG. 5 is illustrated in FIGS. 6A–6H. First, as illustrated in FIG. 6A, the 1 square micron area of exposed carbon layer 10 to which the S-layer array 12 is bound is fabricated by depositing a photoresist material 26 onto a larger carbonffilm and then exposing and developing this resist using conventional prior art microdevice fabrication methods in the area where the nanostructure is to be formed. A hydrophobic resist material is chosen to minimize binding of the S-layer to the surface of resist 26. Then, array 12, consisting of the S-layer is disposed in the space on substrate 10 layed open after removal of the exposed photoresist. Then, as illustrated in FIG. 6B, a one nanometer thick layer of Ta/W is deposited as described above with respect to FIG. 1. That is, overlayer 14 is deposited using evaporative beam techniques applied at a 40° angle to the normal. It should be noted that the undeveloped layers of photoresist 26, i.e., those areas where the carbon layer of substrate 10 is not exposed, will also be coated with the Ta/W.

Figure 6C:
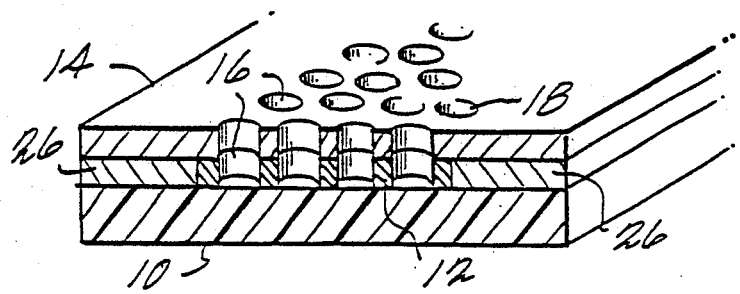

In FIG. 6C, holes 18 are formed in overlayer 14 using argon ion mlling at normal incidence. In this example, a 2 KV beam of 0.2 ma/cm$^2$ is employed for 25 seconds This has the effect of transferring spatially ordered pattern 16 in array 12 to overlayer 14., Note that the size of the screen formed depends on the time of exposure to the argon ion milling For example, thinner sized screen strips and larger holes can be produced by increasing the exposure time to ion milling from 25 to 30 seconds. Conditions, of course, will vary depending upon the thickness of metal film 14 and exact specifications of the ion mill.

In addition to ion milling, holes 18 can be formed by X-ray irradiation, electromagnetic irradiation, electron beam irradiation, particle beam irradiation, etching, chemical removal, solvent removal, plasma treatment or any combination of these various techniques.

Figure 6D:
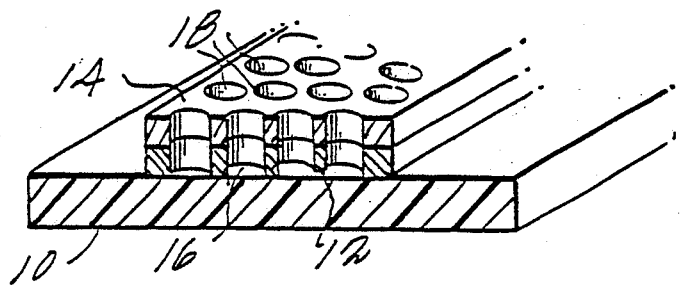

In FIG. 6D, the areas of substrate 10 which had been covered by photoresist 26 and film 14 are removed by exposing and developing the photoresist using conventional methods.

Figure 6E:
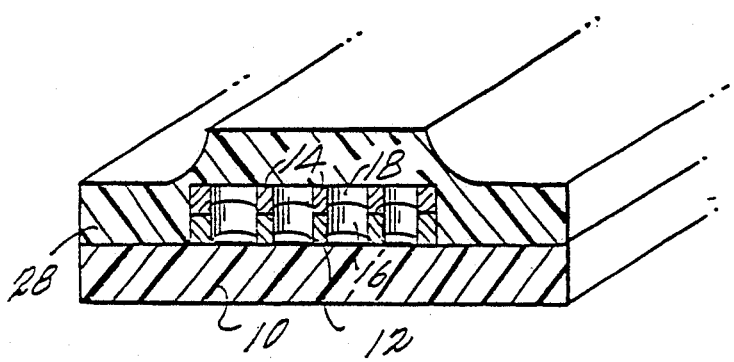
Figure 6F:
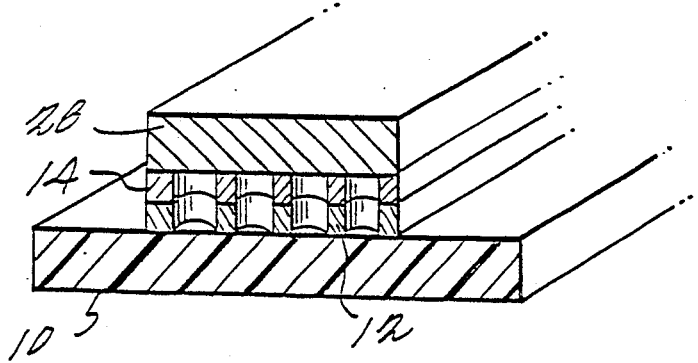
Figure 6G:
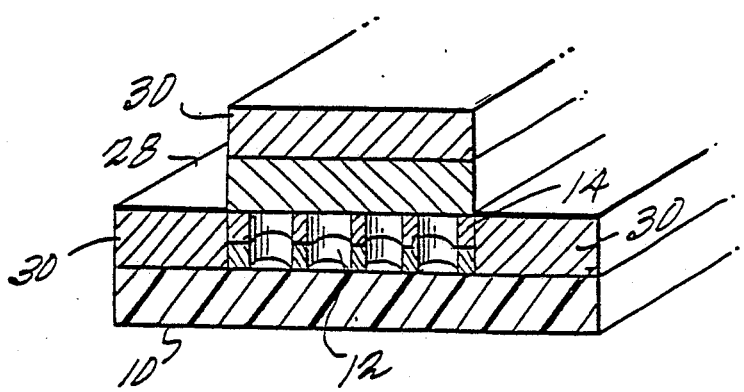
Figure 6H:
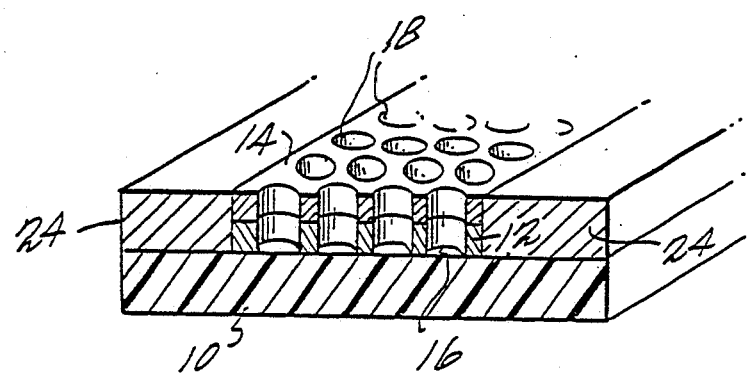

In FIGS. 6E–6H, conductors 24 of micron dimension are fabricated on substrate 10 leading to and from the nanostructure device using conventional methods In FIG. 6E, photoresist layer 28 is placed over the entire area of substrate 10 including areas covered by the 1 nanometer thick Ta/W film 14 which contains the nanometer screen pattern. A wire pattern is exposed on photoresist 28 and upon developing, the photoresist is removed from areas where the wire pattern occurs in FIG. 6F. In FIG. 6G, conducting metal layer 30, such as aluminum, is deposited. In those areas where the wire pattern has been developed, metal 30 will directly coat carbon base 10. In step 6H, photoresist 28 and overlying metal 30 are removed, leaving only conducting metal layer 24 to form,the wires.

Although the nanostructure described was produced on a carbon layer, it is to be understood that a similar method can be used to produce nanometer patterned devices on other useful solid state surfaces such as silicon. In addition, while the fabrication of only a single nanometer patterned microdevice was described, a similar multistep method could be used to fabricate in parallel many such nanodevices which are arranged in a complex pattern comprising an electronic or optical integrated circuit.

Although conventional electrodes have been utilized in the example of FIGS. 6A–6H which directly connect to the nanostructure array, alternative methods of interacting directly with such a patterned array are also possible. For example, each individual nanostructure can be addressed using a scanning tunnelling microscope probe. In the case of optically sensitive material, entire arrays can be addressed with a focused laser beam.

The device as illustrated in FIGS. 1 and 5 can be considered a microsubstrate comprising a base substrate, a lithographic mask or template material containing an ordered nanometer scale pattern and overlying material to which the patterned nanometer scale detail has been transferred. The method described in FIGS. 6A–6H demonstrates that such a microsubstrate can be used to produce a microdevice based on the nanometer patterned array. In contrast to conventional methods for production of micropatterns, the methods thus far described and the articles produced therefrom.allow significantly smaller patterns to be produced. For example, conventional photo-lithographic methods for production of integrated circuits result in microdevices typically one micron square area. The embodiment described in FIGS. 6A–6H results in the patterning of several thousand nanostructures in a one micron square area.

In addition, as described with respect to FIG. 6A–6H, conventional lithography can be used in conjunction with the microsubstrate to produce a nanometer pattern within the normally unpatterned area used to produce conventional micro devices. The present invention also offers significant advantages over more conventional methods of writing nanometer size patterns on a substrate surface with an electron beam. The present invention allows for parallel production of large numbers of nanometer structures thus offering a significant decrease in the time it would take to produce the same microdevices with the serial write method, for example with a scanning electron beam.

Figure 7A:
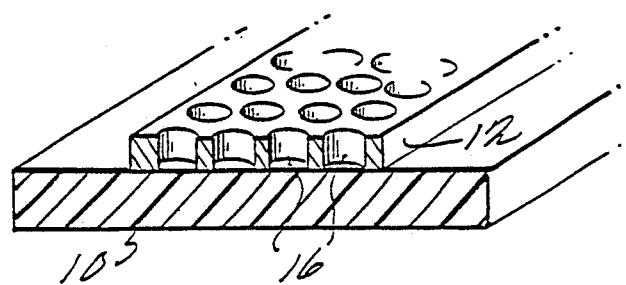
FIGS. 7A-7D schematically illustrate the method of forming a nanostructure in accordance with yet another embodiment of the present invention; , FIGS. 8A-8D schematically illustrate the steps of forming a structure according to the present invention with a multilayered substrate having material deposited therein and having an overlying pattern of material commensurate with the deposits in the substrate.
Figure 7B:
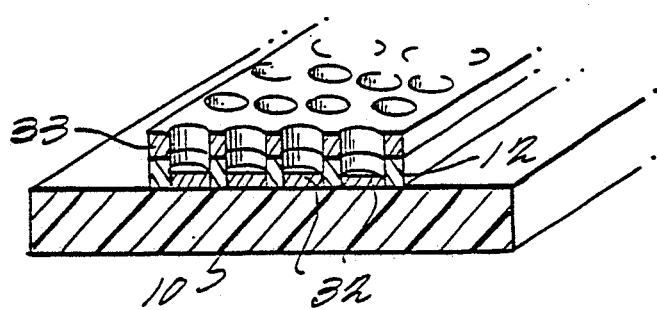

FIGS. 7A–7D illustrate a manner in which the structure of FIG. 2 and other useful structures can be formed. As illustrated in FIG. 7A, array 12 is formed on substrate 10. Then, as illustrated in FIG. 7B, a three nanometer thick layer 33 on array 12 and pro3ections 32 in holes 16 through array 12 is formed using an evaporative beam at normal incidence. This structure may be created in the same manner as illustrated in FIGS. 6A-6B except that the metal is applied at normal incidence. Layer 33 and projections 32 may be a metal, such as Ta/W or any other material.

Figure 7C:
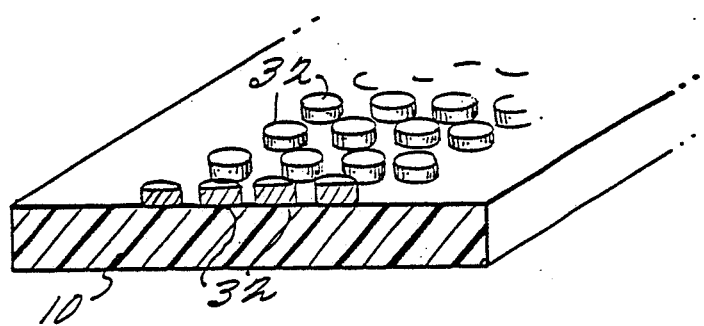

In FIG. 7C, array 12 is lifted off with layer 33 to leave projections 32 deposited on substrate 10. Projections 32 obviously have the same pattern as holes, 16 in array 12. Array 12 can be lifted off using a number of techniques which break up the organic biomolecular array and do not effect projections 32. For example, array 12 may be exposed to a detergent solution such as 5% SDS (sodium dodecylsulfate), proteolyt enzymes which specifically degrade protein, or acid such as HCl, or a combination cf these solvents. Patterning of micron dimension electrical conducti g wires which lead to and from the nanometer array of projeotions 32 can be accomplished using conventional micro fabrication methods similar to those described with respect to FIGS. 6E-6H.

Figure 7D:
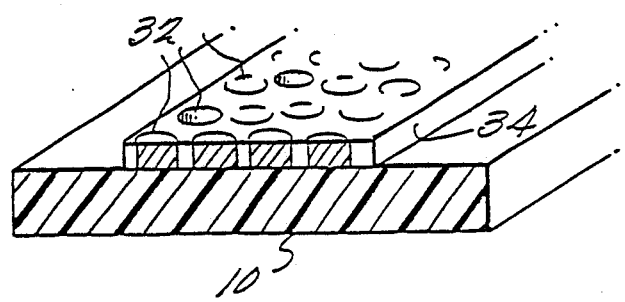

An additional step may also be desirable as illustrated in FIG. 7D to fill the area between projections 32 with a second dissimilar material 34 such as an insulator. This can be accomplished by evaporating such a material directly onto the surface of the device containing the nanometer array.

Figure 6I:
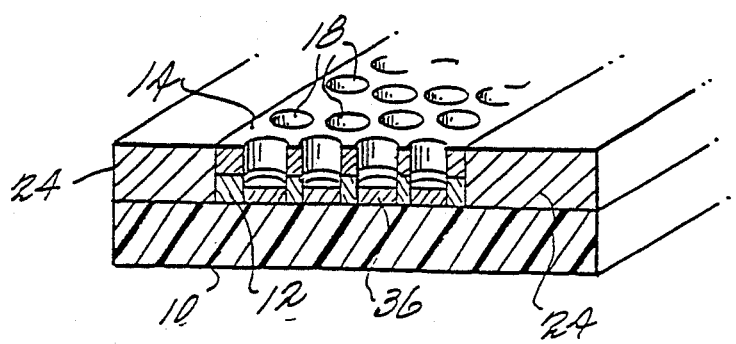
FIG. 6I represents a nanostructure according to another embodiment of the present invention.

Similarly, after fabrication in accordance with FIGS. 6A-6H, a dissimilar material 36 may be evaporated onto the assembly to fill holes 16 in array 12 as illustrated in FIG. 6I.

Although evaporative beam techniques have been employed in the embodiments above to apply material, material can also be applied using molecular or atomic beam epitaxy, sputtering, chemical deposition, electrophoretic deposition, crystallization, binding, using,an adhesive or any combination of these materials.

Figure 8A:
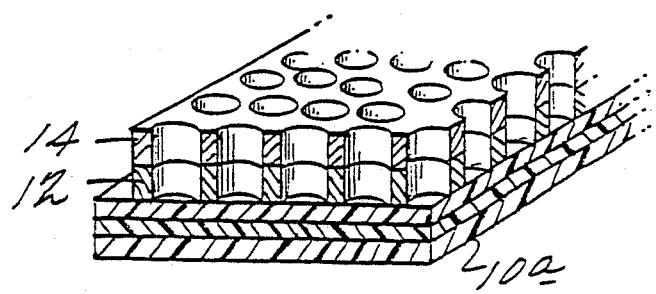
FIG. 8E is a schematic illustration of a nanostructure according to the present invention with a multilayered substrate having deposits therein and an overlying pattern of material incommensurate with the deposits in the substrate.
Figure 8B:
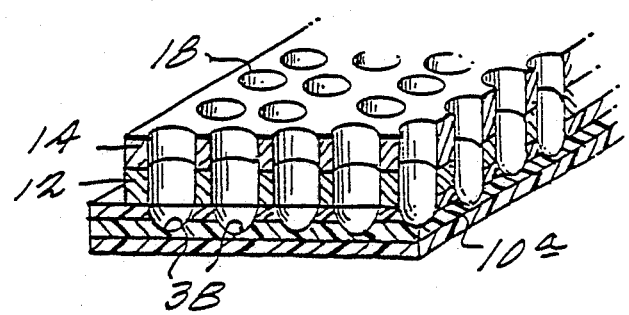

As has been mentioned above, the substrate may be layered as illustrated in FIGS. 8A-8E. Layers of subst,-rate 10a may be single crystals of mixed atomic layers as formed by molecular beam epitaxy. These crystals are stacks of planar nanometer thick sheets, parallel to the crystal surface, each composed of a few atomic layers, with alternating composition. Heterogeneous semiconductor and metallic materials have been formed this way. As substrate base 10a, these materials are structured on a nanometer scale in the direction normal to the planar surface (Z-direction). Further nanometer structuring of these materials is possible in and on the planar surface (X,Y directions). A method for structuring such material is illustrated in FIGS. 8A-8E. In FIG. 8A, array 12 and overlayer 14 are formed on layered substrate 10a in accordance with the techniques described above. Overlayer 14 may then be employed as a mask for etching or ion milling pits 38 in substrate 10a as illustrated in FIG. 8B. Pits 38 may be etched in a selected number of layers of substrate 10a.

Figure 8C:
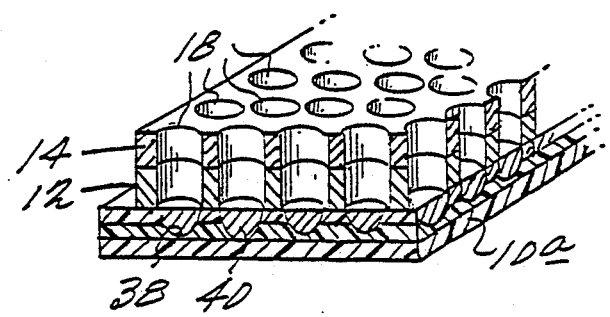

As illustrated in FIG. 8C, pits 38 may be filled with material 40 by evaporation, producing a composite material structured in three dimensions. For example, material 40 may be nanometer dimension metal areas embedded in layered semiconductor substrate 10a.

Figure 8D:
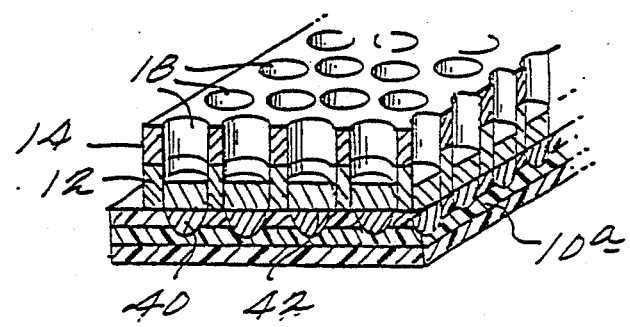

A three-dimensionally patterned material produced as just described may then be a substrate for further nanofabrication steps using the methods described herein. For example, as illustrated in FIG. 8D, material 42 may be applied to the surface of material 40 through holes 18 in overlayer 14. As a more concrete example, in FIG. 8,C, material 40 may be one semiconductor material embedded in another semiconductor material (or the same material of differing impurity concentrations or doping) of substrate 10a. Then, in FIG. 8D, protein array 12 can be readsorbed commensurate with material 40 and used in a second fabrication step in which material 42 is applied through holes 18 in layer 12. For example, nanometer dimension p-type semiconductor regions 40 may be formed in an n-type semiconductor layer of substrate 10a. Then, the assembly could be covered by nanometer dimension metal islands 42.

Figure 8E:
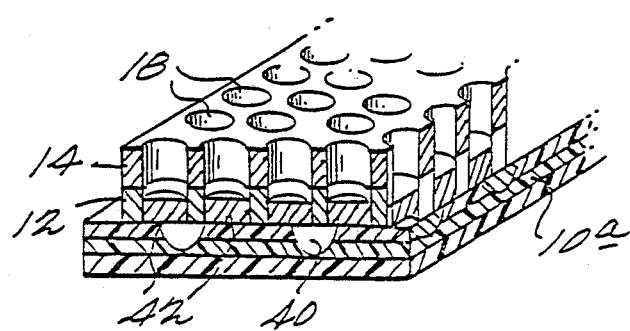

Alternatively, instead of readsorbing an array 12 commensurate with material 40, different protein crystal which give incommensurate registration with the patterned surface could be used as illustrated in FIG. 8E. This would serve to break the periodicity of the nanometer pattern to produce more complex Moire-like structures that vary in a regular way but on a larger length scale as the surface is traversed.

A nanometer patterned device produced using the methods illustrated in FIGS. 6A-6I, 7A-7D and 8A-8E and similar devices which can be patterned using modifications of these procedures may be employed to create a number of extremely useful devices. For example, a basic pattern for a number of superconducting and quantum interference devices is based on the fabrication of arrays of micron-sized metal islands spaced by an insulator, or the complementary structure consisting of a continuous metal sheet with a periodic array of insulating holes. The method for production of both of these structures on a nanometer length scale, is described in FIGS. 6A8E and additional mpdifications described below.

A particularly advantageous structure in accordance with the present invention includes an array of superconducting nanometer size metal islands separated by nonsuperconductors. In this case a metal such as $Nb_3Sn$ which becomes superconducting at temperatures below 18° K are deposited as described with respect to FIGS. 7A-7C. A nonsuperconducting layer such as a normal metal is then deposited as shown in FIG. 7D. Electrodes are deposited on the surface of the microsubstrate base at the edges of the nanometer patterned array to enable current to flow in the plane of the film, parallel to the rows of islands.

In this configuration, each row of islands behaves as a series connection of an SIS (superconductor-insulator-superconductor) junction. Such a junction is recognized as a device for the detection of long-wavelength radiation with high sensitivity. Conventional microfabrication of such SIS junctions is based on the use of conventional lithographic integrated circuit fabrication methods. This results in array junctions with dimensions on the scale of microns.

A major advantage of patterning such an array of nanometer size SIS junctions is the enhanced dynamic range which increases as the square of the number of junctions connected in series in the array. In addition, the parallel connection of rows reduces the array inductance and thereby reduces the effects of junction and voltage threshold heteroge,neity which would normally result if the SIS junctions vary in size. A second advantage of such a microdevice which acts as a sensitive microwave detector is the ability to place several thousand of these device arrays in a small area less than 1 cm square. Hence, spatial detection of microwave field gradients is facilitated.

A second advantageous device made in accordance with steps similar to those illustrated in FIGS. 6A-6I is a nanometer pattern consisting of a superconducting screen 14 containing holes 18. One advantage of such a network of holes 18 is realized when it is connected to electrodes which enable current to flow in the plane of the screen. It is generally recognized that in this case an increased current carrying capacity occurs relative to a continuous superconducting film due to the ability of the holes to trap flux vortices. This is a desirable property of a superconductor since without flux pinning it is recognized that superconductors will exhibit flux instability, dissipation, temperature rise and quenching.

A desirable property of such a two-dimensional network of holes on the nanometer size scale in a metal is the appearance of quantum interference effects. In particular, since an electron mean free path in a metal of greater than 10 nm is generally achievable at room or moderately low temperature, there will exist quantum interference effects in a nanometer network film fabricated from normal metal using the method of FIGS. 6A-6I or similar methods without going to extremely low temperatures. Such a property is advantageous for use, in a magnetic field or current detection device since the quantum interference effect will be sensitive to applied magnetic fields. Such quantum interference effects form the basis for the use of conventional SQUID (superconducting quantum interference devices) which are fabricated on the micron scale using conventional microfabrication techniques. The advantage of the present invention is that a large number of smaller quantum interference devices can be fabricated in parallel. Furthermore, due to the size of these devices the quantum interference effects will be realized without going to extremely low temperature and without the use of superconducting materials.

Another embodiment of the present invention involves the fabrication of a nanometer patterned array consisting of a screen and projections each consisting of dissimilar semiconducting materials such as doped and undoped GaAs. Such a nanometer patterned array would constitute a two-dimensional superlattice. One-dimensional superlattices consisting of alternating nanometer layers of semiconductor material have been fabricated using prior-art-methods and are the basis for several new classes of opto/electronic devices. It is recognized that the ability to carry out nanostructure fabrication on surfaces and the extension of the superlattice concept into two and three dimensions will lead to potential applications which cannot be realized with one-dimensional superlattices. These arise from additioal modifications of the electronic band structure with quantization in two and three dimensions. The advantage of the methods illustrated in FIGS. 6A-8E and similar methods for producing two-dimensional superlattices is increased speed and flexibility of fabrication over conventional methods. Three-dimensional superlattices may also be fabricated using the techniques described with respect to FIGS. 8A-8E in order to deposit two-dimensional superlattices on top of each other.

An additional advantage of the basic method of this invention lies in the ease by which a nanometer composite pattern of immobilized functional molecules and an additional material such as a semiconductor can be fabricated. One starting point for fabrication of such a composite material is the structure illustrated in FIG. 6H. In this case, nanometer holes 16 formed are filled with a specific molecule 36 with a desired functional property as illustrated in 6I. Such properties may include enzymatic activity, sensitivity to electromagnetic and particle radiation, fluorescence, electrical, magnetic, thermal conduction, chemical reactivity and mechanical.

As a specific example, a nanometer size memory array utilizing the biomembrane protein, bacteriorhodopsin, which is found in the purple membrane of *Halobacterium halobium*, which exhibit several of the aforementioned properties, may be employed. This embodiment is formed by following steps illustrated in FIGS. 6A-6H, which results in fabrication of the article shown in FIG. 5. It is to be understood that a variety of materials may be chosen from which to fabricate patterned screen 14 which contains a, network of nanometer size holes 18. This structure can be employed to make a biosensor by incorporating active biomolecules 36 in nanometer dimension holes 16. For example, enzymes (which bind molecules to be sensed) can be attached by a variety of chemical modifications of substrate 10 or subsequent to the hole fabrication. Enzymes which exhibit a change in dipole moment or charge flux in the direction normal to the substrate surface will induce a voltage between substrate 10 and perforated metal 14. This voltage can be read out via the deposited wires if they are separated from the substrate (conducting in this case) by an insulating layer.

In this application, the periodic nanopatterning offers two big advantages: (1) It allows the sensor molecules to occupy sites between the two conductors, i.e., between the perforated metal film and the conductive substrate. (2) The holes allow free access to the sensor molecules from fluid adjacent to the perforated surface.

The binding of bacteriorhodopsin (bR) molecules inside the nanometer pattern of holes 16 can be accomplished using a variety of methods which depend on the nature of the device substrate base 10. For example, a method for selective binding of protein molecules such as bR on a carbon substrate has been described. Zingsheim, H.P. Zingsheim, *Scanning Electron Microscopy*, Vol. I, pp. 357-364 (1977), was able to demonstrate the inhomogeneous binding characteristics of a patterned surface for protein adsorption. In this experiment an insulin-coated carbon film was used as a target onto which 3-4 nm side contamination lines at spacings of about 50nm were drawn using electron beam writing, by a STEM. Subsequent to the beam writing, two-dimensional surface charge patterns can be produced if the specimens are immersed in electrolyte solutions. Specimens prepared in this manner contain sufficient information to direct molecules of the protein ferritin to predetermined adsorption sites with a precision of 2-5 nm.

Alternatively, antibody molecules which selectively bind bR and can be produced using conventional methods in pure form can be first immobilized inside holes 16. In this case, a suspension of bR trimers which retain the functional properties of bR molecules found in the intact purple membrane are bound selectively by the antibodies in the vicinity of holes 16. This later method of selectively binding bR can be easily applied to other molecules for which an antibody can be developed. This includes almost all proteins including those possessing biocatalytic properties.

An additional method of filling holes 16 with bR 36 involves self-assembly of the native purple membrane lattice using conventional two-dimensional crystallization methods which involve the incubation of a detergent solution of bR and lipid molecules over the surface of the device shown in FIG. 5. Typically, intact purple membrane fragments are solubilized in a 0.2-1.0% solution of cetyltriammonium (CTAB) detergent which should be used in pure form. The solution is then slowly dried by reverse,phase evaporation over a period of several days. It is important to render holes 12 hydrophilic by exposing the article of FIG. 5 to a glow discharge in order to promote the bR solut,ion to enter holes 12. In addition, large holes over 20nm are advantageous in order to accommodate several bR trimers.

Ferritin molecules as material 36 may be selectively bound in nanometer holes 16 formed by patterned screen 14. The ferritin can be made to preferentially adsorb to free holes 16 in pattern 12 as opposed to metal strips 14 by., for example, a surface coating of the poly-amino acid poly-llysine. The poly-l-lysine may be applied before a carbon substrate 10 is glow discharge treated and before the adsorption of two-dimensional biomembrane 12. Alternatively, the poly-l-lysine may be applied prior to metallization and ion milling of biomembrane 12. In either case, the poly-l-lysine will be exposed, after the milling procedure, only at metal free holes 16. The cationic polylysine will then serve to bind the anionic ferritin, resulting in the ferritin as material 36 being bound preferentially to metal free holes 12 and not metal strips 14.

In addition to bare ferritin, the above nanoheterostructure formation can be accomplished using ferritin which has been previously conjugated to another biological molecule. As an example of a ferritin conjugate, ferritin can be conjugated to concanavalin A, which is a lectin, that is, a plant protein with a high affinity for certain sugar residues.

It is possible to conjugate ferritin to an antibody (or immunoglobulin). As an example, it is possible to form a ferritin.-conjugated antibody directed against the protein spectrin. This ferritin-conjugated antibody can be selectively adsorbed on a patterned template 12, thus forming a nanohete,rostructure. Then, spectrin may be deposited on the surface of the nanoheterostructure to strongly bind at those sites containing the ferritin-conjugated antibody.

A nanoheterostructure can also be formed comprising a solid state pattern 12 with preferential adsorption of a biological molecule 32 or 36 having catalytic activity. Enzymes are complex proteins which serve as reaction catalysts. So a nanoheterostructure could be formed with an enzyme bound at specific sites on patterned template 12. For example, the enzyme invertase could be bound at select sites and the sugar sucrose will be hydrolyzed at these catalytic sites.

A nanoheterostructure can also be formed by adsorbing a non-biological material, for example, colloidal gold to ordered pattern 12. Moreover this colloidal gold can be bare or can be readily conjugated to immunoglobulins (antibodies), antigens, protein A, or other biological materials.

Yet another structure in accordance with the present invention is a two-dimensional array 12 of the. nanometer size elements which constitute a high-density information storage medium. This property stems from the ability of bR to behave as a multistate switch. Since the bR molecule functions as a light driven proton transport element, it is sensitive to electromagnetic radiation as well as changes in the electrical potential across it. It has been demonstrated that application of a potential can result in alterations in the s,tate of bR as determined by a shift in its normal adsorption maximum from 570 nm to red-shifted adsorption maxima typically near 610 nm. Production of such a shift requires total potentials across the 5 nanometer transverse length of the bR molecule of less than 300 mV. Such a potential can be applied locally to a hole 16 filled with bR molecules using a vacuum tunnelling and scanning microscope probe as has been developed by Binnig, Rohrer et al, "7×7 Reconstruction on Si(III) Resolved in Real Space" Phys. Rev. Ltr. Vol. 50, p. 120 (1983) and references cited therein. The ground voltage level can be determined by substrate base 10 which can be fabricated from a conducting material. In this case screen 14 should be fabricated from an insulator. In order to enhance charging above the bacteriorhodopsin the molecules can be decorated with nanometer conducting metal particles using published procedures. Each individual memory element can be addressed by scanning the tunnelling probe with subnanometer precision over the two-dimensional ordered array of holes 16 filled with bR until the hole for which information is to be written or read is selected. Writing consists of applying a voltage to the bR molecules in holes 16, thereby altering their state which is accompanied by an adsorption change. Reading can be accomplished by probing changes in potential developed across hole 16 by use of the tunnelling probe. Such molecular switching can be achieved using, this method in any protein having multiple states with different dipole or charge distributions.

Additionally, nanoheterostructures may be formed in which the,ordered pattern consists of a pattern of islands 32 to which pattern is preferentially adsorbed a conducting polymer 34 (see FIG. 7D). An example of such a conducting polymer is poly(para-phenylene), or PPP, and its derivatives. Another conducting polymer for nanoheterostructure formtion is polypyrole.

As an alternative to prefetentially adsorbing a single conducting polymer to an island 32 of the pattern, it is possible to produce a deposition of the polymers such that a single polymer will connect two (or more) islands 32. This is accomplished, for example, with polymers having binding sites along its length rather than just at its terminus, or with polymers having binding sites at both ends and its length is commensurate with the spacing of islands 32. More generally, the number of monomers forming the polymer could be adjusted so that the length of the polymer chain is compatible with the lattice spacing of islands 32, or some multiple of the lattice spacing.

It is to be understood that there are numerous other advantageous devices which can result from the binding of functional molecules to a nanometer patterned array. Examples include surface catalytic arrays, nanometer templates for crystallization and polymerization, bimolecular sensors, surface enhance Raman scattering detectors and substrates, pyroelectric detectors and digital films for lithography and imaging.

Although a few exemplary embodiments of this invention have been described in detail above, those skilled in the art readily appreciate that many modifications are possible in the preferred embodiment,s without materially depatting from the novel teachings and advantages of this invention. Accordingly, all such modifications are intended to be included within the scope of this invention, as defined by the following claims.

What is claimed is:

1. A method of forming a pattern on a nanometer scale comprising the steps of:

binding to a substrate surface a self-assembled two-dimensionally ordered material array forming a two-dimensional spatial pattern of at least one of thickness, density and chemical reactivity variations, said pattern having a characteristic dimension of 1-50 nanometers, forming at least one overlayer on said array; and forming a two-dimension, nanometer scale pattern of holes in said overlayer which is determined by said pattern in said array.

2. A method of forming a pattern on a nanometer scale comprising the steps of:

binding to a substrate surface a self-assembled two-dimensionally ordered array of nondenatured protein molecules said two dimensional array forming a two-dimensional spatial pattern of at least one of thickness, density and chemical reactivity variations, said pattern having a characteristic dimension of 1-50 nanometers; and transferring a two-dimensional nanometer scale pattern formed from said at least one of thickness, density and chemical activity variations onto said substrate.

3. A method of forming a pattern on a nanometer scale comprising the steps of:

binding to a substrate surface a self-assembled two-dimensionally ordered array of nondenatured protein molecules said two dimensional array forming a two-dimensional spatial pattern of holes, said holes having a dimension of 1-50 nanometers; and applying material to an assembly of said array and said substrate to form projections in said holes bound to said substrate.

4. A method of forming a pattern on a nanometer scale comprising the steps of:

binding to a substrate surface a self-assembled two-dimensionally ordered material array forming a two-dimensional spatial pattern of at least one of thickness, density,and chemical reactivity variations, said pattern having a characteristic dimension of 1-50 nanometers; and removing material from portions of said substrate corresponding, to said spatial pattern to form pits.

5. A method of forming a pattern on a nanometer scale comprising the steps of:

binding to a substrate surface a self-assembled two-dimensionally ordered material array forming a two-dimensional spatial pattern of at least one of thickness, density and chemical reactivity variations, said pattern having a characteristic dimension of 1-50 nanometers;

forming at least one overlayer on said array;

forming a two-dimensional nanometer scale pattern ins aid overlayer, which is determined by in said array; and connecting at least one of said array and said overlayer to at least one conductive electrode.

6. A method as in claim 4 further comprising the step of filling said pits with material different from said substrate 7. A method as in claim 6 wherein said substrate is multi-layered and said pits extend down into at least two layers and said method further comprises the steps of:

applying material on the surface of said substrate in accordance with a two-,dimensional spatial pattern having a characteristic dimension of 1-50 nanometers.

8. A method as in claim 6 wherein said substrate is multi-layered and said holes extend comprising the steps of replacing said array with another self assembled two-dimensionally ordered array forming another two-dimensional spatial pattern of holes different from said pattern of said array, said another pattern having a characteristic dimension of 1-50 nanometers; and filling said holes in said another pattern with material extending above said substrate 9. A method as in claim 1 further comprising the step of applying conductive electrodes to at least one of said overlayer and said array.

10. A methgd as in claim 1 further comprising the step of applying material different from said array and said overlayer through said holes in said overlayer.

11. A method as in claim 1 or 2 further comprising the final step of removing said array.

12. A method as in claim 1 further comprising the step of removing said overlayer.

13. A method as in claims 1, 2, 3 or 4 wherein said binding of said array includes the step of electrically binding said array spatially differentiated part of said substrate surface.

14. A method as in claim 13 wherein said electrically binding step includes the steps of:

applying a conducting layer to said spatially differentiated part of said substrate; and charging said conducting layer, said array being bound. in areas defined by said charging.

15. A method as in claims 1, 2, 3 or 4 wherein said array binding step includes the step of charging the substrate surface by exposing the substrate surface to charged partcles, plasma, atoms or molecules.

16. A method as in claims 1, 2, 3 or 4 wherein said array binding step includes the step of adding adhesive to said substrate surface to bind said array to said substrate.

17. A method as in claims 1 3 or 4 wherein said array binding step includes the step of crystallizing said array in situ on said substrate surface.

* * * * *